United States Patent
Kim et al.

(10) Patent No.: US 9,231,231 B2
(45) Date of Patent: Jan. 5, 2016

(54) ORGANIC LIGHT EMITTING DIODE DISPLAY AND MANUFACTURING METHOD THEREOF

(71) Applicant: Samsung Display Co., Ltd., Yongin, Gyeonggi-do (KR)

(72) Inventors: Il-Nam Kim, Yongin (KR); Won-Sang Park, Yongin (KR); Min-Woo Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/770,825

(22) Filed: Feb. 19, 2013

(65) Prior Publication Data

US 2014/0027731 A1   Jan. 30, 2014

(30) Foreign Application Priority Data

Jul. 25, 2012  (KR) ................ 10-2012-0081342

(51) Int. Cl.
*H01L 29/08* (2006.01)
*H01L 51/52* (2006.01)
*H01L 51/56* (2006.01)
*H01L 27/32* (2006.01)

(52) U.S. Cl.
CPC ........ *H01L 51/5271* (2013.01); *H01L 27/3258* (2013.01); *H01L 51/56* (2013.01); *H01L 27/3246* (2013.01)

(58) Field of Classification Search
CPC ..... H01L 27/32; H01L 27/3225; H01L 51/50; H01L 27/288; H01L 51/5271; H01L 27/3258; H01L 51/56; H01L 27/3246

USPC .......... 257/40, 89, 98, E51.018, E51.001, 21, 257/79, 88; 438/24, 116, 29, 72, 82
See application file for complete search history.

(56) References Cited

U.S. PATENT DOCUMENTS

| | | | |
|---|---|---|---|
| 2005/0161665 A1* | 7/2005 | Winters et al. ................. | 257/40 |
| 2008/0101748 A1* | 5/2008 | Jilani et al. ..................... | 385/18 |
| 2008/0199667 A1* | 8/2008 | Cho .............................. | 428/212 |
| 2010/0110526 A1* | 5/2010 | Chui .............................. | 359/290 |
| 2011/0193070 A1* | 8/2011 | Yamazaki et al. .............. | 257/40 |
| 2011/0254437 A1* | 10/2011 | Yamada et al. ............... | 313/504 |
| 2012/0033001 A1* | 2/2012 | Kim et al. ...................... | 345/697 |
| 2012/0049207 A1* | 3/2012 | Kim et al. ...................... | 257/88 |
| 2013/0003001 A1* | 1/2013 | Inoue et al. ................... | 349/123 |

FOREIGN PATENT DOCUMENTS

| | | |
|---|---|---|
| KR | 10-2006-0042779 | 5/2006 |
| KR | 10-2007-0119234 | 12/2007 |
| KR | 10-2011-0021260 | 3/2011 |

* cited by examiner

*Primary Examiner* — Jarrett Stark
*Assistant Examiner* — Shahed Ahmed
(74) *Attorney, Agent, or Firm* — Knobbe Martens Olson & Bear LLP

(57) ABSTRACT

Disclosed are an organic light emitting diode display and a manufacturing method thereof, and more particularly, an organic light emitting diode display capable of minimizing resistance increase of a second electrode and improving light extraction efficiency at the same time by forming a separate reflector, and a manufacturing method thereof.

13 Claims, 2 Drawing Sheets

ORGANIC LIGHT EMITTING DIODE DISPLAY AND MANUFACTURING METHOD THEREOF

CROSS-REFERENCE TO RELATED APPLICATIONS

This application is based on and claims priority from Korean Patent Application No. 10-2012-0081342, filed on Jul. 25, 2012 with the Korean Intellectual Property Office, the present disclosure of which is incorporated herein in its entirety by reference.

BACKGROUND

1. Field

The present disclosure relates to an organic light emitting diode display and a manufacturing method thereof, and more particularly, to an organic light emitting diode display capable of minimizing increase in resistance of a second electrode and improving light extraction efficiency at the same time by forming a separate reflector, and a manufacturing method thereof.

2. Description of the Related Technology

An organic light emitting diode display is a self-emission display device which has an organic light emitting diode which emits light to display an image. Since the organic light emitting diode display does not require a separate light source like a liquid crystal display does, it is possible to relatively reduce thickness and weight thereof. Further, the organic light emitting diode display has high quality characteristics such as low power consumption, high luminance, and high response speed. One application of an organic light emitting diode display is as a display device for portable electronic apparatuses.

An organic light emitting diode is an element using light generated when an electron and a hole are coupled with each other to emit light and the emitted light is dissipated. Generally, the organic light emitting diode includes an electrode for injecting a hole, an electrode for injecting an electron, and an emission layer, and has a structure in which the emission layer is laminated between a positive electrode which is the electrode for injecting a hole and a negative electrode which is the electrode for injecting an electron. When the electron is injected to the negative electrode of the organic light emitting diode and the hole is injected to the positive electrode, charges thereof move in an opposite direction to each other by an external electric field and then are coupled with each other in the emission layer to emit light during emission and dissipation. In the organic light emitting diode, the emission layer is made of a single molecular organic material or a polymer.

The organic light emitting diode display has a multilayer laminated structure, and the light generated from the emission layer is placed in the layer of the organic light emitting diode display and thus a ratio of light which is not discharged outside is considerably high. The phenomenon may be caused by a waveguide phenomenon due to total reflection, and light extraction efficiency in the organic light emitting diode display is considerably low at about 20%. Accordingly, in the organic light emitting diode display, it is very important to increase the light extraction efficiency.

SUMMARY OF CERTAIN INVENTIVE ASPECTS

The present disclosure has been made in an effort to provide an organic light emitting diode display capable of improving light extraction efficiency by forming a reflector on a pixel defining layer and a manufacturing method thereof One embodiment provides an organic light emitting diode display, including: a substrate; an insulating layer disposed on the substrate; a first electrode disposed on the insulating layer; a pixel defining layer overlapped with an end portion of the first electrode; a reflector disposed on the pixel defining layer; a spacer disposed on the reflector; an organic emission layer disposed through the upper portion of the spacer and the first electrode; and a second electrode disposed on the organic emission layer, in which the end portion of the reflector is overlapped with the first electrode.

The organic light emitting diode display may further include a semiconductor element disposed on the substrate and electrically connected with the first electrode. Meanwhile, the semiconductor element is a thin film transistor (TFT).

An inflection point may be formed at a contact point between the pixel defining layer and the reflector.

The spacer may extend to the upper portion of the pixel defining layer to cover the reflector.

The reflector may be buried between the pixel defining layer and the spacer.

An inflection point may be formed at a contact point between the pixel defining layer and the spacer.

A distance between the contact point between the pixel defining layer and the reflector and the contact point between the pixel defining layer and the spacer may be from about 0.5 to about 3 μm.

The pixel defining layer may have an inclined angle $\theta 1$ of about 30° to 75° to the first electrode at a contact point with the first electrode.

The spacer may have an inclined angle $\theta 2$ of about 30° to 60° to the pixel defining layer at a contact point with the pixel defining layer.

The pixel defining layer may include a first pixel defining layer overlapped with the end portion of the first electrode and a second pixel defining sub-layer formed on the first pixel defining sub-layer.

The second pixel defining sub-layer may have an inclined angle $\theta 3$ of about 30° to 75° to the first pixel defining sub-layer at a contact point with the first pixel defining sub-layer.

The reflector may contain at least one selected from a group constituted by Al, Ti, Mg and Ag.

Further, the present disclosure provides a manufacturing method of the organic light emitting diode display.

Another embodiment provides a manufacturing method of an organic light emitting diode display, including: forming an insulating layer on a substrate; forming a first electrode on the insulating layer; forming a pixel defining layer so as to be overlapped with an end portion of the first electrode; forming a reflector on the pixel defining layer; forming a spacer on the reflector; forming an organic emission layer through the upper portion of the spacer and the first electrode; and forming a second electrode on the organic emission layer.

In the forming of the pixel defining layer, an inflection point may be formed at a contact point between the pixel defining layer and the reflector.

The spacer may be formed to extend to the upper portion of the pixel defining layer to cover the reflector.

The reflector may be formed to be disposed between the pixel defining layer and the spacer.

An inflection point may be formed at a contact point between the pixel defining layer and the spacer.

A distance between the contact point between the reflector and the pixel defining layer and the contact point between the spacer and the pixel defining layer may be about 0.5 to about 3 μm.

The pixel defining layer may have an inclined angle θ1 of about 30° to 75° to the first electrode at a contact point with the first electrode.

The spacer may have an inclined angle θ2 of about 30° to 60° to the pixel defining layer at a contact point with the pixel defining layer.

The forming of the pixel defining layer may include forming a first pixel defining sub-layer and forming a second pixel defining sub-layer.

The second pixel defining sub-layer may have an inclined angle θ3 of about 30° to 75° to the first pixel defining sub-layer at a contact point with the first pixel defining sub-layer.

The reflector may contain at least one of Al, Ti, Mg and Ag.

In the organic light emitting diode display according to the embodiments of the present disclosure, total reflection of light generated inside is prevented by additionally forming a reflector on a pixel defining layer, such that it is possible to improve light extraction efficiency without reducing a thickness of a second electrode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Figure 1:
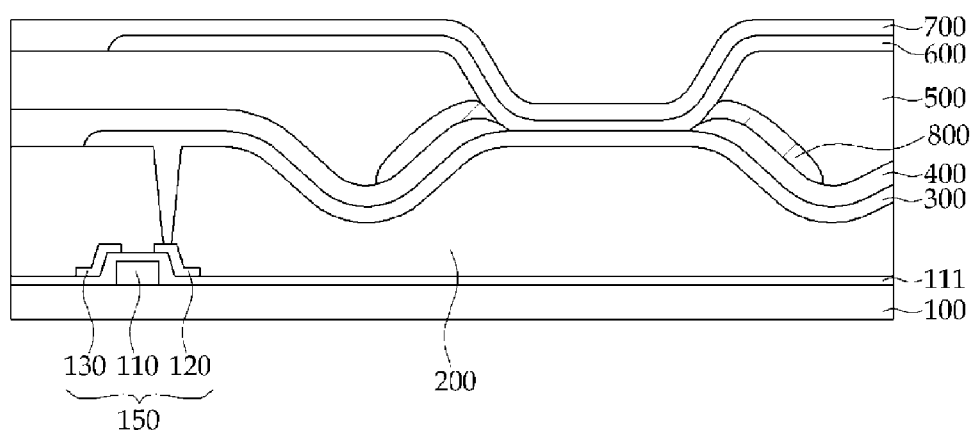
FIG. 1 is a diagram schematically illustrating a structure of an organic light emitting diode display according to an embodiment of the present disclosure.

Hereinafter, embodiments of the invention will be described in detail with reference to the accompanying drawings.

Although the present disclosure can be modified variously and have several embodiments, specific embodiments are illustrated in the accompanying drawings and will be described in detail. However, the scope of the present disclosure is not limited to the specific embodiments and should be construed as including all the changes, equivalents, and substitutions included in the spirit and scope of the present disclosure.

Terms used in the present disclosure select normal terms which are widely used presently, but in some cases, a term which is arbitrarily selected by an applicant exists, and in this case, a meaning thereof should be understood by being disclosed in the description of the present disclosure or considering the used meaning.

Parts which are not associated with the description are omitted in order to specifically describe the present disclosure in the drawings and like reference numerals generally refer to like elements throughout the specification. Further, in the drawings, size and thickness of each element are arbitrarily illustrated for convenience of description, and the present disclosure is not necessarily limited to those illustrated in the drawings.

In the drawings, the thicknesses of layers and regions may be enlarged for clarity. In the drawings, the thicknesses of a layer and a region may be exaggerated for convenience of description. It will be understood that when an element such as a layer, film, region, or substrate is referred to as being "on" another element, it can be directly on the other element or intervening elements may also be present.

FIG. 1 is a cross-sectional view schematically illustrating an organic light emitting diode display according to an embodiment of the present disclosure.

As illustrated in FIG. 1, an organic light emitting diode display according to an embodiment of the present disclosure includes a substrate 100, an insulating layer 200 disposed on the substrate 100, a first electrode 300 disposed on the insulating layer 200, a pixel defining layer 400 overlapped with an end portion of the first electrode 300 and disposed between the electrodes, a reflector 800 disposed on the pixel defining layer 400, a spacer 500 disposed on the reflector 800, an organic emission layer 600 disposed through the upper portion of the spacer 500 and the first electrode 300, and a second electrode 700 disposed on the organic emission layer 600.

As the substrate 100, a transparent insulation substrate may be used. For example, the substrate 100 may be a glass substrate, a quartz substrate, a transparent resin substrate, and the like. The transparent resin substrate which may be used as the substrate 100 may include polyimide resin, acrylic resin, polyacrylate resin, polycarbonate resin, polyether resin, polyethylene terephthalate resin, sulfonic acid resin, and the like. These resins may be used either alone or in combination thereof As illustrated in FIG. 1, a semiconductor element 150 may be formed on the substrate 100. An example of the semiconductor element is a thin film transistor (TFT) including a gate electrode, a source electrode, and a drain electrode. In FIG. 1, a case where the first electrode 300 is a positive electrode is exemplified, and the first electrode 300 as the positive electrode may be electrically connected with the drain electrode 120 of the thin film transistor (TFT). The semiconductor element may be formed by a general method of forming the thin film transistor. Accordingly, the description for a detailed method of forming the semiconductor element or the thin film transistor is omitted.

Meanwhile, a lower structure (not shown) including a switching element, a contact pad, a plug, an electrode, a conductive pattern, an insulation pattern, and the like may be provided on the substrate. In this case, the lower structure may be disposed at a position which is not overlapped with a main luminescent region on the first electrode.

FIG. 1 illustrates an example in which the TFT as a semiconductor element is formed on the substrate. In FIG. 1, a gate electrode 110 is formed on the substrate 100, and a gate insulating layer 111 for insulating the gate electrode is formed on the substrate 100. A source electrode 130 and a drain electrode 120 are formed on the gate insulating layer. The gate electrode 110, the drain electrode 120, and the source electrode 130 are elements configuring the TFT, which are referred to as a semiconductor element 150.

After the source electrode 130 and the drain electrode 120 are formed, the insulating layer 200 is formed all over the surface of the substrate 100. The insulating layer 200 has a thickness enough to cover the lower structures formed on the substrate 100.

The insulating layer 200 may have an inclined portion. The inclined portion corresponds to a position where a reflector 800 may be disposed. The organic light emitting diode display illustrated in FIG. 1 may be of a bottom emission type, in which a display surface is formed on the substrate side, and in this case, a reflector 800 is formed on the inclined portion so that a part of the light generated from the emission layer 600 is reflected onto the reflector 800 to be discharged to the substrate side.

Figure 2:
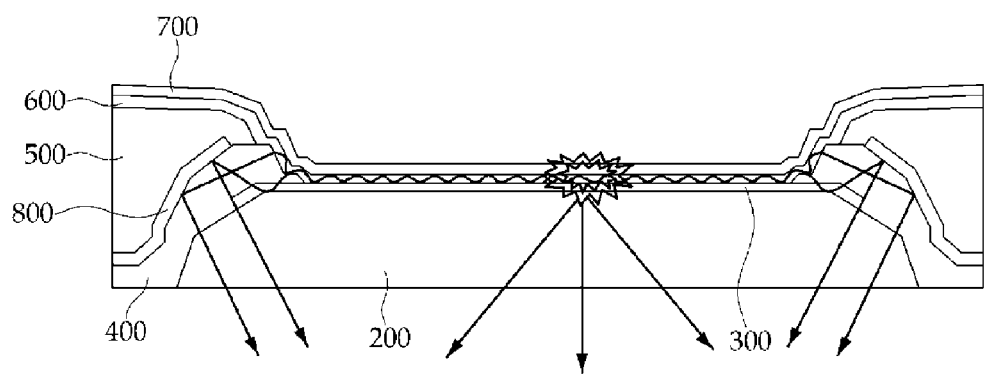
FIG. 2 is a diagram illustrating a light extraction mechanism in the organic light emitting diode display according to an embodiment.

The part of the light generated from the emission layer 600 is directly discharged to the substrate side, but a lot of light is placed in the organic light emitting diode display. Particularly, in the organic light emitting diode display formed in the multilayer, a waveguide is formed, and a lot of light moves through the waveguide by total reflection and then is dissipated in the organic light emitting diode display. As illustrated in FIG. 2, the reflector 800 is disposed on a path of the waveguide and thus the light moving along the waveguide by the total reflection is reflected onto the reflector 800 to be discharged to the substrate side.

As such, in order for the reflector 800 to be disposed on the waveguide, the inclined portion is formed on the insulating layer 200 and the main luminescent region of the first electrode 300 is disposed in a region adjacent to the inclined portion, and then the reflective layer 800 is disposed at a position close to the main luminescent region, and as a result, light to be dissipated by the total reflection is reflected onto the reflector 800 to be discharged to the substrate side.

As illustrated in FIG. 1, the insulating layer 200 having the inclined portion is disposed on the substrate 100. In this case, the insulating layer 200 has a thickness enough to cover the lower structures formed on the substrate 100.

According to an embodiment, in order to improve flatness of the insulating layer 200 formed on the substrate, a planarization process may be performed on the substrate 100. For example, a chemical mechanical polishing (CMP) process, an etch-back process, and the like are performed on the substrate 100 and thus the substrate 100 may have a flat upper surface.

According to an embodiment, the insulating layer 200 may contain an organic material. For example, the insulating layer 200 may contain a material selected from photoresist, acrylate-based polymer, polyimide-based polymer, polyamide-based polymer, siloxane-based polymer, polymer containing photosensitive acryl carboxyl group, novolac resin, and alkali developable resin. These materials may be used either alone or in combination thereof According to other embodiments, the insulating layer 200 may be formed by using an inorganic material such as silicon compound, metal, metal oxide, and the like. For example, the insulating layer 200 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide(HfOx), zirconium oxide (ZrOx), and titanium oxide (TiOx). These materials may be used either alone or in combination thereof The insulating layer 200 may be formed on the substrate 100 by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like, according to a constituent material.

The first electrode 300 is formed on the insulating layer 200. The first electrode 300 may be electrically connected to the drain electrode 120 of the thin film transistor 150.

The first electrode 300 may be formed by using a light transmissive conductive material. For example, the first electrode 300 may contain at least one of indium tin oxide, indium zinc oxide, zinc tin oxide, zinc oxide, tin oxide, and gallium oxide. These materials may be used either alone or in combination thereof According to an embodiment, the first electrode 300 may be formed on a part of the insulating layer 200 by coating a material for the first electrode 300 on the entire surface of the insulating layer 200 and then patterning the material for the first electrode 300. The first electrode layer may be formed by a method such as a sputtering process, a vacuum deposition process, a chemical vapor deposition process, a pulse laser deposition process, a printing process, and an atomic layer deposition process using the material for the first electrode 300.

A through-hole which is connected to the semiconductor element 150, or TFT, through the insulating layer 200 may be formed in the insulating layer 200. A part of the semiconductor element 150 is exposed by the through-hole, a contact structure or a pad structure is formed in the through-hole and the exposed semiconductor element 150, for example, the thin film transistor (TFT), and the first electrode 300 formed on the insulating layer 200 may be connected to the contact structure or the pad structure. Accordingly, the first electrode 300 may be electrically connected to the semiconductor element 150 through the contact structure or the pad structure.

Next, the pixel defining layer 400 is formed on the insulating layer 200 and the first electrode 300. The pixel defining layer 400 may be formed by using an organic material, an inorganic material, and the like. For example, the insulating layer 400 may contain a material selected from an organic material such as photoresist, polyacryl-based resin, polyimide-based resin, and acryl-based resin or an inorganic material such as silicon compound.

A material for forming the pixel defining layer 400 is coated on the first electrode 300 and the entire upper portion of the insulating layer 200 and then partially etched to form the pixel defining layer 400 so that a part of the first electrode 300 is exposed. For example, the first electrode 300 may be exposed by using a photolithography process or an etching process using an additional etching mask.

Figure 3:
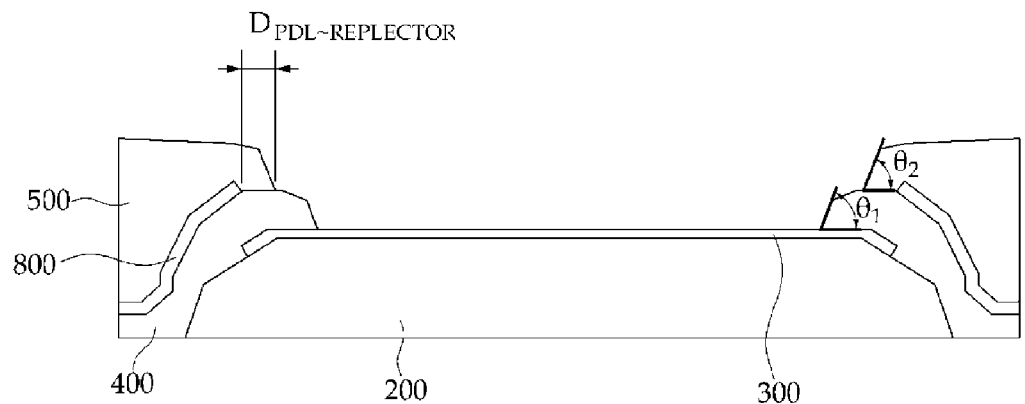
FIG. 3 is a diagram schematically illustrating a partial structure of the organic light emitting diode display according to an embodiment.

FIG. 3 is a diagram for describing elements which need to be controlled in order to improve light extraction efficiency in the organic light emitting diode display according to an embodiment of the present disclosure, and parts which are not associated with the description are omitted to simply illustrate the structure.

As illustrated in FIG. 3, a side wall of an opening of the pixel defining layer 400 may have an inclined angle $\theta_1$ to the first electrode 300 at a contact point with the first electrode 300. For example, the side wall of the opening of the pixel defining layer 400 may have an inclined angle $\theta_1$ of about 30° to about 75° in a substantially horizontal direction to the first electrode 300.

Figure 4:
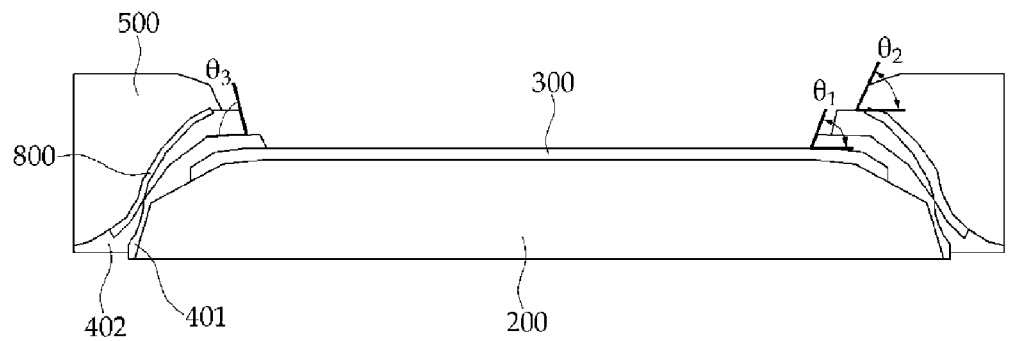
FIG. 4 is a diagram schematically illustrating a partial structure of the organic light emitting diode display according to another embodiment.

FIG. 4 is a diagram for describing elements which need to be controlled in order to improve light extraction efficiency in an organic light emitting diode display according to another embodiment of the present disclosure, and parts which are not associated with the description are omitted to simply illustrate the structure.

As illustrated in FIG. 4, the pixel defining layer 400 may include a first pixel defining sub-layer 401 overlapped with an end portion of the first electrode 300 and a second pixel defining sub-layer 402 formed on the first pixel defining sub-layer 401. In this embodiment, the first pixel defining sub-layer 401 and the second pixel defining sub-layer 402 may be made of the same material as the pixel defining layer 400, or they may be made of different materials.

As described above, when the pixel defining layer 400 includes the first pixel defining sub-layer 401 and the second pixel defining sub-layer 402, a side wall of an opening of the first pixel defining sub-layer 401 may have an inclined angle θ1 to the first electrode 300 at a contact point with the first electrode 300. Further, a side wall of an opening of the second pixel defining sub-layer 402 may have an inclined angle θ3 to the upper surface of the first pixel defining sub-layer 401 at a contact point with the first pixel defining sub-layer 401. For example, the side wall of the opening of the first pixel defining sub-layer 401 may have an inclined angle θ1 of about 30° to about 75° in a substantially horizontal direction to the first electrode 300, and the side wall of the opening of the second pixel defining sub-layer 402 may have an inclined angle θ3 of about 30° to about 75° in a substantially horizontal direction to the upper surface of the first pixel defining sub-layer 401.

As described above, after the pixel defining layer 400 is formed, the reflective layer 800 is formed thereon. Since a material having low conductivity and high reflection is used as a material for forming the reflector 800, a selection range of the material is wide. For example, the reflector 800 may contain at least one selected from a group constituted by Al, Ti, Mg and Ag.

The spacer 500 is formed on the reflector 800. The spacer 500 extends to the top of the pixel defining layer 400 to cover the reflector 800, and may have an inclined angle θ2 to the pixel defining layer 400 at a contact point with the pixel defining layer 400. For example, the spacer 500 may have an inclined angle θ2 of about 30° to about 60° in a substantially horizontal direction to the pixel defining layer 400.

The reflector 800 is placed between the pixel defining layer 400 and the spacer 500. In FIG. 1, a form where the reflector 800 covers the pixel defining layer 400 is illustrated, but the reflector 800 may be formed in any form capable of reflecting light at the side, and the end portion of the reflector 800 is formed to be overlapped with the first electrode 300.

According to an embodiment of the present disclosure, inflection points are formed at the contact point between the pixel defining layer 400 and the reflector 800 and the contact point between the pixel defining layer 400 and the spacer 500. The inflection point indicates a point where the light deviates from the waveguide and thus a path of the light is changed, and the light which is placed in the waveguide due to the inflection point is input to the pixel defining layer 400 to be frontally collected through the reflector 800.

As described above, in order to input the light which is placed in the waveguide to the pixel defining layer 400, a control for the elements illustrated in FIG. 3 is required. The elements may include a distance (represented by $D_{PDL-REFLECTOR}$ in FIG. 3) from the contact point between the pixel defining layer 400 and the reflector 800 to the contact point between the pixel defining layer 400 and the spacer 500, an inclined angle θ1 between the pixel defining layer 400 and the first electrode 300 at the contact point therebetween, and an inclined angle θ2 between the spacer 500 and the pixel defining layer 400 at the contact point therebetween.

In the organic light emitting diode display according to an embodiment, in order to maximally improve light extraction efficiency, the $D_{PDL-REFLECTOR}$ is preferably between about 0.5 μm and about 3.0 μm. If the $D_{PDL-REFLECTOR}$ is outside of this range, it is difficult to form an inflection point to deviate from the waveguide.

Further, the inclined angles θ1 and θ2 are about 25° or more, and in some cases, may be about 30° to 75°. When the θ1 and θ2 are too small, the light does not deviate from the waveguide, and on the contrary, when the θ1 and θ2 are too large, the light is leaked and thus loss of light occurs.

As described above, FIG. 4 is a partial structure of the organic light emitting diode display according to another embodiment in which the pixel defining layer 400 includes the first pixel defining sub-layer 401 and the second defining sub-layer 402.

In the above structure, since the waveguided light is input into the pixel defining layer 400 at each of the inflection points which are formed at the contact point between the first pixel defining sub-layer 401 and the first electrode 300, the contact point between the first pixel defining sub-layer 401 and the second pixel defining sub-layer 402, and the contact point between the second pixel defining sub-layer 402 and the spacer 500, a large amount of light may be input into the reflector 800. Accordingly, as the pixel defining layer 400 is additionally formed in many layers, an improvement effect of light extraction is further increased.

According to another embodiment of the present disclosure, it is possible to improve the light extraction efficiency by controlling the three elements illustrated in FIG. 4. The control elements correspond to the inclined angle θ1 between the first pixel defining sub-layer 401 and the first electrode 300 at the contact point therebetween, the inclined angle θ2 between the spacer 500 and the first pixel defining sub-layer 401 at the contact point therebetween, and the inclined angle θ3 between the second pixel defining sub-layer 402 and the first pixel defining sub-layer 401 at the contact point therebetween. In order to improve the light extraction efficiency by preventing the light from deviating from the waveguide and being leaked at the same time, the inclined angles θ1, θ2 and θ3 are about 25° or more, for example, in the range of about 30° to 75°.

Next, the organic emission layer 600 is formed on the exposed first electrode 300 and the spacer 500.

The organic emission layer 600 may be formed by using emission materials capable of generating different color lights such as red light, green light, and blue light according to each pixel of the organic light emitting diode display. According to another embodiment, the organic emission layer 600 may have a multilayer structure which emits white light by laminating a plurality of emission materials capable of implementing different color lights such as red light, green light, and blue light. According to another embodiment, the organic emission layer 600 may additionally include a host material having a substantially large band gap as compared with the emission materials.

According to an embodiment, the organic emission layer 600 is positioned on the first electrode 300. Further, the organic emission layer 600 extends from the first electrode 300 in the luminescent region to be also formed above the pixel defining layer 400 and the spacer 500. As illustrated in FIG. 1, the bottom of the organic emission layer 600 is positioned on the first electrode 300, and the side of the organic emission layer 600 contacts the pixel defining layer 400 and the spacer 500.

According to an embodiment of the present disclosure, a first emission auxiliary layer (not shown) may be formed between the first electrode 300 and the organic emission layer 600. The first emission auxiliary layer may include at least one of a hole injection layer and a hole transport layer. A second emission auxiliary layer (not shown) may be formed between the organic emission layer 600 and the second electrode. The second emission auxiliary layer may include at least one of an electron injection layer and an electron transport layer.

Next, the second electrode 700 is formed on the organic emission layer 600. The second electrode 700 may be formed on the organic emission layer 600 at a regular thickness. The second electrode 700 may be formed by using a reflective material. For example, the second electrode 700 may contain a material selected from metal such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. These materials may be used either alone or in combination thereof According to an embodiment, the second electrode 700 may be formed all over the surface of the organic emission layer 600. According to another embodiment, the second electrode 700 may be positioned only in the luminescent region. For example, the second electrode 700 may be formed on a part of the organic emission layer 600. In this case, a second electrode layer (not shown) is formed all over the surface on the organic emission layer 600 and then patterned to form the second electrode 700 which is selectively disposed only in the luminescent region.

Figure 5:
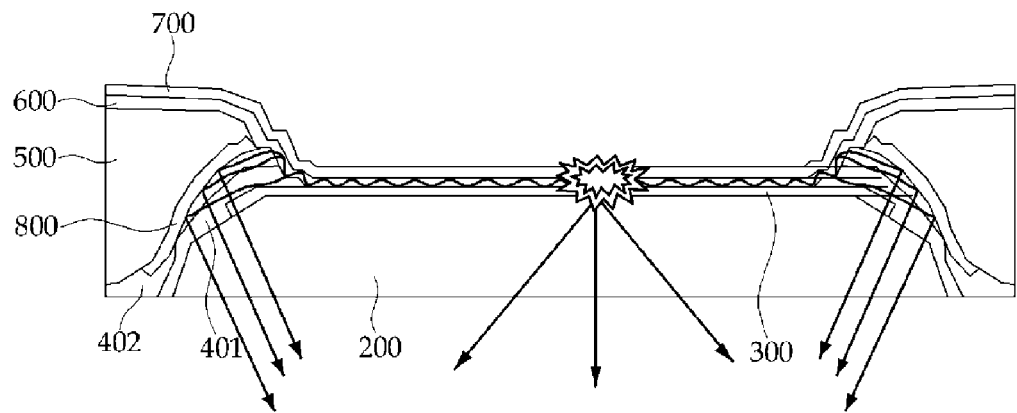
FIG. 5 is a diagram illustrating a light extraction mechanism in the organic light emitting diode display according to another embodiment.

FIG. 5 is a diagram illustrating a light extraction mechanism in the organic light emitting diode display according to another embodiment.

According to an embodiment, as illustrated in FIG. 5, by preventing total reflection of light generated inside by additionally forming the reflector 800 on the pixel defining layer 400, it is possible to minimize reduction in the thickness of the second electrode 700 which is caused by forming the inclined portion for reflection of light in the organic light emitting diode display in the related art. Therefore, in the organic light emitting diode display according to embodiments disclosed herein, it is possible to minimize a defect in current uniformity due to increase in resistance of the second electrode 700 as compared with the organic light emitting diode display in the related art.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting diode display, comprising:
a substrate;
an insulating layer disposed on the substrate;
a first electrode disposed on the insulating layer;
a pixel defining layer overlapped with and contacting an end portion of the first electrode;
a reflector disposed on and contacting the pixel defining layer, and spaced apart from the first electrode;
a spacer disposed on the reflector;
an organic emission layer disposed through an upper portion of the spacer and the first electrode; and
a second electrode disposed on the organic emission layer, wherein the end portion of the reflector is overlapped with the first electrode and wherein the reflector is disposed between the first electrode and the second electrode.

2. The organic light emitting diode display of claim 1, wherein the display comprises a plurality of pixels, and wherein the pixel defining layer is disposed between respective pixels.

3. The organic light emitting diode display of claim 1, further comprising: a semiconductor element disposed on the substrats and electrically connected with the first electrode.

4. The organic light emitting diode display of claim 1, wherein an inflection point is formed at a contact point between the pixel defining layer and the reflector.

5. The organic light emitting diode display of claim 1, wherein the spacer extends to the upper portion of the pixel defining layer to cover the reflector.

6. The organic light emitting diode display of claim 5, wherein the reflector is disposed between the pixel defining layer and the spacer.

7. The organic light emitting diode display of claim 5, wherein an inflection point is formed at a contact point between the pixel defining layer and the spacer.

8. The organic light emitting diode display of claim 5, wherein a distance between the contact point between the pixel defining layer and the reflector and the contact point between the pixel defining layer and the spacer is from about 0.5 µm to about 3 µm.

9. The organic light emitting diode display of claim 1, wherein the pixel defining layer has an inclined angle θ1 of about 30° to 75° to the first electrode at a contact point with the first electrode.

10. The organic light emitting diode display of claim 5, wherein the spacer has an inclined angle θ2 of about 30° to 60° to the pixel defining layer at a contact point with the pixel defining layer.

11. The organic light emitting diode display of claim 1, wherein the pixel defining layer includes a first pixel defining sub-layer overlapped with the end portion of the first electrode and a second pixel defining sub-layer formed on the first pixel defining layer.

12. The organic light emitting diode display of claim 11, wherein the second pixel defining sub-layer has an inclined angle θ3 of about 30° to 75° to the first pixel defining layer at a contact point with the first pixel defining layer.

13. The organic light emitting diode display of claim 1, wherein the reflector contains at least one selected from a group constituted by Al, Ti, Mg and Ag.

* * * * *